United States Patent
Choi et al.

(10) Patent No.: US 7,642,593 B2
(45) Date of Patent: Jan. 5, 2010

(54) NONVOLATILE MEMORY DEVICE AND METHOD OF FABRICATING THE SAME

(75) Inventors: Yong-Suk Choi, Jiwaseong-si (KR); Jeong-Uk Han, Suwon-si (KR); Hee-Seog Jeon, Suwon-si (KR); Yong-Tae Kim, Yongin-si (KR); Seung-Jin Yang, Seoul (KR); Hyok-Ki Kwon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 238 days.

(21) Appl. No.: 11/698,658

(22) Filed: Jan. 26, 2007

(65) Prior Publication Data
US 2007/0170491 A1 Jul. 26, 2007

(30) Foreign Application Priority Data
Jan. 26, 2006 (KR) ........................ 10-2006-0008419

(51) Int. Cl.
*H01L 21/336* (2006.01)
(52) U.S. Cl. ........................ 257/316; 257/330; 257/315; 257/E21.428; 438/259
(58) Field of Classification Search ................. 438/259; 257/315, 316, 330, 326, 324, E21.419, E21.428, 257/314
See application file for complete search history.

(56) References Cited

U.S. PATENT DOCUMENTS

| | | | |
|---|---|---|---|
| 5,045,488 A | | 9/1991 | Yeh |
| 5,049,956 A | * | 9/1991 | Yoshida et al. ............... 257/317 |
| 6,661,067 B1 | * | 12/2003 | Ngo et al. .................... 257/413 |
| 6,873,006 B2 | | 3/2005 | Chen et al. |
| 7,064,379 B2 | | 6/2006 | Kutsukake et al. |
| 7,208,376 B2 | | 4/2007 | Chen et al. |

| | | | |
|---|---|---|---|
| 2002/0145162 A1 | | 10/2002 | Kamada et al. |
| 2004/0183118 A1 | | 9/2004 | Chen et al. |
| 2005/0023597 A1 | | 2/2005 | Kutsukake et al. |
| 2005/0104115 A1 | * | 5/2005 | Kianian ...................... 257/314 |
| 2005/0199914 A1 | | 9/2005 | Chen et al. |
| 2006/0202257 A1 | | 9/2006 | Kutsukake et al. |

FOREIGN PATENT DOCUMENTS

| | | |
|---|---|---|
| JP | 2001217326 | 8/2001 |
| JP | 2002-305258 | 10/2002 |

(Continued)

*Primary Examiner*—Brook Kebede
*Assistant Examiner*—Maria Ligai
(74) *Attorney, Agent, or Firm*—Mills & Onello, LLP

(57) ABSTRACT a nonvolatile memory device Includes an active region defined in a semiconductor substrate and a control gate electrode crossing over the active region. A gate insulating layer is interposed between the control gate electrode and the active reigon. A floating gate is formed in the active region to penetrate the control gate electrode and extend to a predetermined depth into the semiconductor substrate. A tunnel insulating layer is successively interposed between the control gate electrode and the floating gate, and between the semiconductor substrate and the floating gate. The floating gate may be formed after a trench is formed by sequentially etching a control gate conductive layer and the semiconductor substrate, and a tunnel insulating layer is formed on the trench and sidewalls of the control gate conductive layer. The floating gate is formed in the trench to extend into a predetermined depth into the semiconductor substrate.

12 Claims, 9 Drawing Sheets

| | FOREIGN PATENT DOCUMENTS | | | | |
|---|---|---|---|---|---|
| JP | 2004-119694 | 4/2004 | KR | 10-2005-0011107 | 1/2005 |
| JP | 2004289161 | 10/2004 | KR | 1020050000324 | 1/2005 |
| KR | 2002-0079380 | 10/2002 | | | |

* cited by examiner

US 7,642,593 B2

NONVOLATILE MEMORY DEVICE AND METHOD OF FABRICATING THE SAME

CROSS-REFERENCE TO RELATED APPLICATIONS

This U.S. non-provisional patent application claims priority under 35 U.S.C. § 119 of Korean Patent Application No. 10-2006-0008419, filed in the Korean Intellectual Property Office on Jan. 26, 2006, the entire contents of which are hereby incorporated by reference.

BACKGROUND

The present invention relates to a semiconductor device and a method of fabricating the same, and more particularly, to a nonvolatile memory device and a method of fabricating the same.

Nonvolatile semiconductor memory devices have the property that stored data is maintained even when an external power supply is removed. Flash memory devices are a type of nonvolatile semiconductor memory device. The flash memory device generally has a floating gate and a control gate electrode. The flash memory device can store logic '1' or logic "0" by injecting/emitting charges into/from the floating gate.

A flash memory device having a split gate structure is disclosed in U.S. Pat. No. 5,045,488. According to the flash memory device disclosed in U.S. Pat. No. 5,045,488, an upper surface of a floating gate is formed into a convex shape using a thermal oxide layer to form a peak at the floating gate.

FIG. 1A is a plan view of a conventional nonvolatile memory device and FIG. 1B is a sectional view taken along a line I-I' of FIG. 1A.

Referring to FIGS. 1A and 1B, in the conventional nonvolatile memory device, device isolation layers 12 are formed on a semiconductor substrate 10 to define an active region, and control gate electrodes 16 are formed such that they cross over the active region. Floating gates 14 are formed between the control gate electrodes 16 and the active region, and the floating gates 14 partially overlap the control gate electrodes 16.

The floating gates 14 and the control gate electrodes 16 are disposed mirror-symmetrically. The device isolation layers 12 define a first active region intersecting the control gate electrodes 16 and second active regions parallel to the control gate electrodes 16. A drain region 18d is formed in the first active region between the control gate electrodes 16, and source regions 18s are formed in the second active regions adjacent to the control gate electrodes 16.

In the conventional nonvolatile memory device, a capping insulating layer interposed between the floating gates 14 and the control gate electrodes 16 is formed using thermal oxidation. However, the bird's beak due to the oxidation makes the high integration of a device difficult. Also, the control gate electrode 16 located above the floating gate 14 is different in shape from the control gate electrode 16 located above the active region, which leads to a thickness difference of the control gate electrode 16. In addition, the source region 18s should be spaced a predetermined distance from the drain region 18d, which makes the high integration of a device difficult.

SUMMARY OF THE INVENTION

The present invention provides a nonvolatile memory device capable of preventing a punch through between a source region and a drain region, and a method of fabricating the same.

The present invention also provides a nonvolatile memory device formed without forming a capping insulating layer using thermal oxidation.

According to a first aspect, the present invention is directed to a nonvolatile memory device including an active region defined in a semiconductor substrate and a control gate electrode crossing over the active region, wherein a gate insulating layer is interposed between the active region and the control gate electrode. A floating gate is formed in the active region to penetrate the control gate electrode and extend to a predetermined depth into the semiconductor substrate. A tunnel insulating layer is successively interposed between the control gate electrode and the floating gate, and between the semiconductor substrate and the floating gate.

In one embodiment, the nonvolatile memory device further includes a source region and a drain region formed in the active region at both sides of the control gate electrode. One of the source region and the drain region laterally extends to a surface of the semiconductor substrate where the tunnel insulating layer is formed.

In one embodiment, a width of the control gate electrode directed toward one of the source region and the drain region from the floating gate is greater than a width of the control gate electrode directed toward the other one of the source region and the drain region.

In one embodiment, one of the source region and the drain region that is adjacent to a portion of the control gate electrode having a relatively smaller width, laterally extends to a surface of the semiconductor substrate where the tunnel insulating layer is formed.

In one embodiment, the nonvolatile memory device further includes spacer patterns formed on sidewalls of the control gate electrode with an insulating layer interposed therebetween.

In one embodiment, the nonvolatile memory device further includes a source region and a drain region formed in the active region at both sides of the control gate electrode, respectively. One of the source region and the drain region extends to the active region where the spacer patterns are formed and a portion of the active region where the control gate electrode is formed. The other one of the source region and the drain region passes through the active region where the spacer patterns are formed and the active region where the control gate electrode is formed, and laterally extends to a surface of the semiconductor substrate where the tunnel insulating layer is formed.

In some embodiments, memory cells of the nonvolatile memory device may be repeatedly disposed on the semiconductor substrate. Specifically, the nonvolatile memory device may include a first active region and second active regions intersecting the first active region defined in a semiconductor substrate, and a pair of control gate electrodes disposed parallel to the second active regions between the second active regions to intersect a portion above the first active region. Floating gates may be formed to penetrate the respective control gate electrodes. The floating gates may extend to a predetermined depth into the active region of the semiconductor substrate. A tunnel insulating layer may be successively interposed between the control gate electrodes and the floating gates, and between the semiconductor substrate and the floating gates.

According to another aspect, the present invention is directed to a nonvolatile memory device, comprising a first active region and second active regions intersecting the first active region defined in a semiconductor substrate. A pair of control gate electrodes are disposed parallel to the second active regions between the second active regions and crossing over the first active region. Floating gates penetrate the respective control gate electrodes to extend to a predetermined depth into the active region of the semiconductor substrate. A tunnel insulating layer is successively interposed between the control gate electrodes and the floating gates, and between the semiconductor substrate and the floating gates.

In one embodiment, the nonvolatile memory device further includes source regions formed in the second active regions at both sides of the pair of control gate electrodes and a drain region formed in the first active region between the control gate electrodes. One of the source and drain regions laterally extends to a surface of the semiconductor substrate where the tunnel insulating layer is formed.

In one embodiment, a width of the control gate electrode directed toward one of the source region and the drain region from the floating gate is greater than a width of the control gate electrode directed toward the other one of the source region and the drain region.

In one embodiment, one of the source region and the drain region that is adjacent to a portion of the control gate electrode having a relatively smaller width, laterally extends to a surface of the semiconductor substrate where the tunnel insulating layer is formed.

In one embodiment, the nonvolatile memory device further includes spacer patterns formed on sidewalls of the control gate electrode with an insulating layer interposed therebetween.

In one embodiment, the nonvolatile memory device further includes a source region and a drain region formed in the active region at both sides of the control gate electrode, respectively. One of the source region and the drain region extends to the active region where the spacer patterns are formed and a portion of the active region on which the control gate electrode is formed. The other one of the source region and the drain region passes through the active region where the spacer patterns are formed and the active region where the control gate electrode is formed, and laterally extends to a surface of the semiconductor substrate where the tunnel insulating layer is formed.

According to another aspect, the present invention is directed to a method of fabricating a nonvolatile memory device, the method including forming a device isolation layer on a semiconductor substrate to define an active region, and forming a gate insulating layer on the active region. A control gate electrode having an opening to expose the gate insulating layer is formed on the gate insulating layer. The gate insulating layer in the opening and a portion of the semiconductor substrate corresponding to the active region is etched to form a trench.

A tunnel insulating layer is formed on the semiconductor substrate exposed through the opening and sidewalls of the control gate electrode. A floating gate is formed, wherein the floating gate is filled in the opening to penetrate the control gate electrode and extend into the trench.

The opening may be formed before or after forming the control gate electrode. The trench may be also formed before or after forming the control gate electrode. The floating gate may be formed after forming the trench and the tunnel insulating layer. Therefore, the floating gate may be formed before or after forming the control gate electrode.

In one embodiment, the forming of the control gate electrode comprises: forming a control gate conductive layer; patterning the control gate conductive layer to form the trench; and patterning the control gate conductive layer to form the control gate electrode crossing over the active region.

In one embodiment, the method further includes patterning the control gate conductive layer to form the control gate electrode crossing over the active region after forming the floating gate in the trench.

In one embodiment, the forming of the control gate electrode comprises: forming a control gate conductive layer intersecting the active region; and patterning the control gate conductive layer to form the trench.

In one embodiment, the method further includes implanting impurities into the active region at both sides of the control gate electrode to form a source region and a drain region. One of the source region and the drain region extends to a surface of the semiconductor substrate where the tunnel insulating layer is formed.

In one embodiment, a width of the control gate electrode serving as one sidewall of the opening is larger than a width of the control gate electrode serving as the other sidewall.

In one embodiment, the method further includes implanting impurities into the active region at both sides of the control gate electrode to form a source region and a drain region. One of the source region and the drain region that is adjacent to a portion of the control gate electrode having a relatively smaller width, extends to a surface of the semiconductor substrate where the tunnel insulating In one embodiment, layer is formed.

In one embodiment, one of the source regions and the drain region that is adjacent to a portion of the control gate electrode having a relatively larger width, extends to a portion of the active region where the control gate electrode is formed.

BRIEF DESCRIPTION OF THE FIGS.

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer is referred to as being 'on' another layer or substrate, it can be directly on the other layer or substrate, or intervening layers may also be present.

Figure 1A:
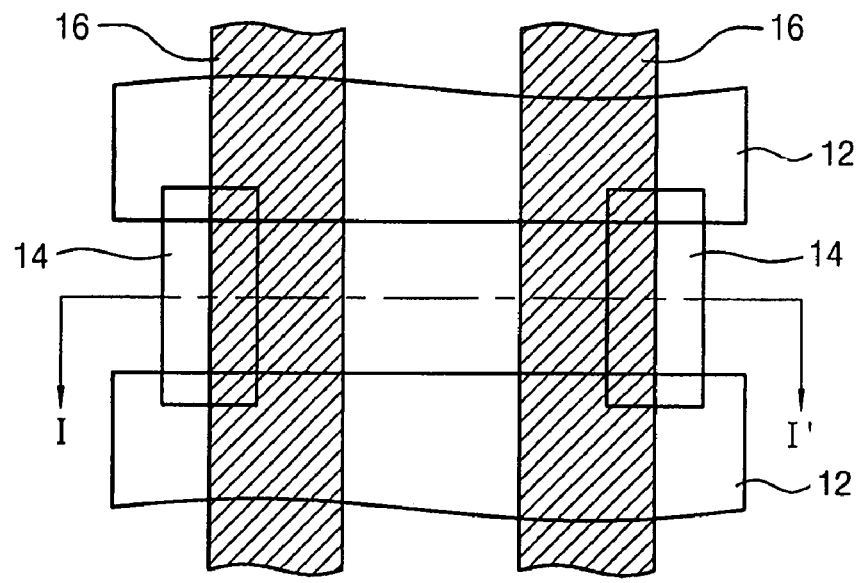
FIG. 1A is a plan view of a conventional nonvolatile memory device.
Figure 1B:
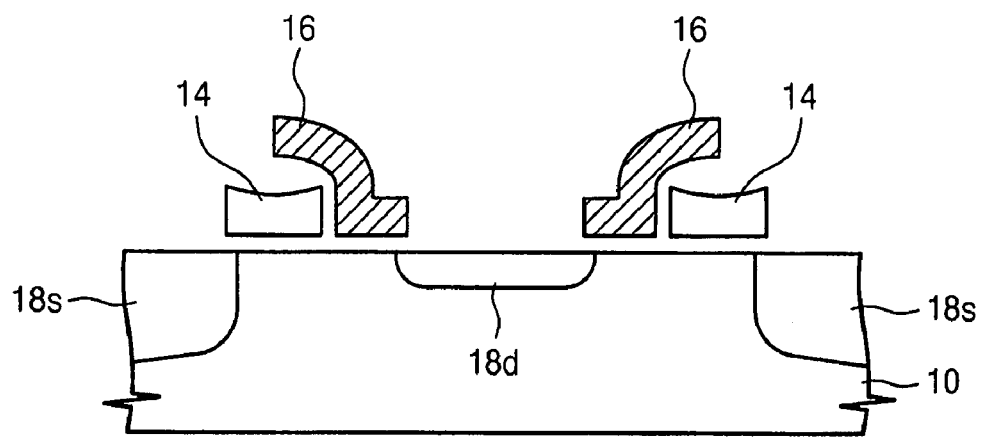
FIG. 1B is a sectional view taken along a line I-I' of FIG. 1A.
Figure 2A:
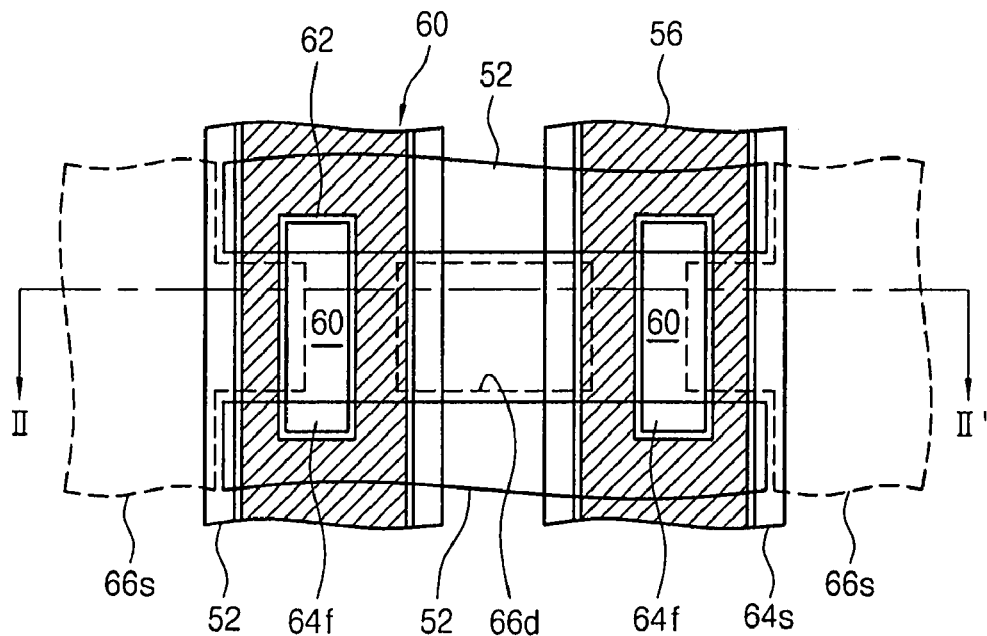
FIG. 2A is a plan view of a nonvolatile memory device according to an embodiment of the present invention.
Figure 2B:
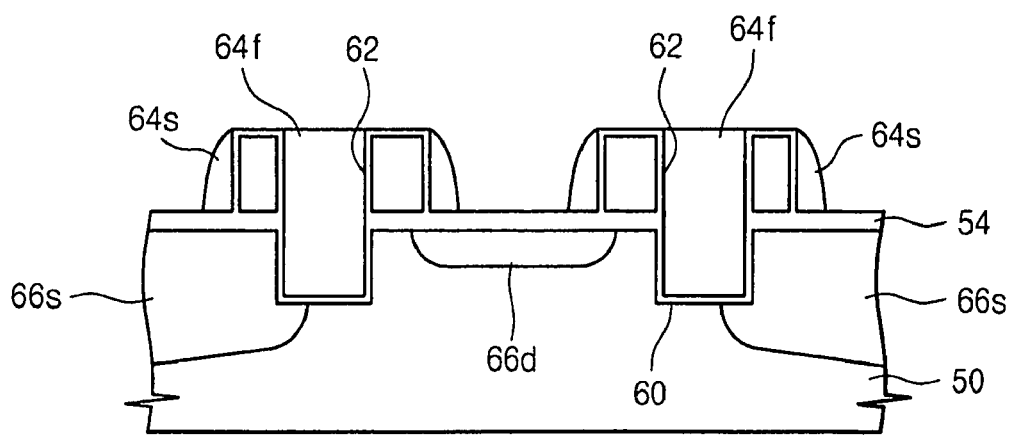
FIG. 2B is a sectional view taken along a line II-II' of FIG. 2A.

FIG. 2A is a plan view of a nonvolatile memory device according to an embodiment of the present invention. FIG. 2B is a sectional view taken along a line II-II' of FIG. 2A.

Referring to FIGS. 2A and 2B, device isolation layers 52 are formed on a semiconductor substrate 50 to define an active region. A pair of control gate electrodes 56 are disposed to cross over the device isolation layers 52 and the active region. Trenches 60 are formed to a predetermined depth in the active region, and floating gates 64f are formed to penetrate the control gate electrodes 56. The floating gates 64f are filled in the trenches 60 to extend to a predetermined depth into the semiconductor substrate 50.

A gate insulating layer 54 is interposed between the control gate electrodes 56 and the active region, and a tunnel insulating layer 62 is successively formed between the control gate electrodes 56 and the floating gates 64f, and between the floating gates 64f and the semiconductor substrate 50. The tunnel insulating layers 62 may be connected to the gate insulating layer 54, and may be successively formed on upper surfaces and outer sidewalls of the control gate electrodes 56.

Spacer patterns 64s may be formed on sidewalls of the control gate electrodes 56. The spacer patterns 64s may be formed together with the floating gates 64f that are formed after forming the control gate electrodes 56. If the floating gates 64f are formed before forming the control gate electrodes 56, the spacer patterns 64s may not be formed.

A drain region 66d is formed in the active region between the control gate electrodes 56, and source regions 66s are formed at both sides of the pair of control gate electrodes 56, respectively. In the embodiment of the present invention, the source regions 66s pass through the active region under the control gate electrodes 56 and extend to the active region under the trenches 60 on which the tunnel insulating layers 62 is formed. That is, the source regions 66s extend to surfaces of the semiconductor substrate 50 on which the tunnel insulating layer 62 is formed, and the drain region 66d extend to the active region on which the control gate electrodes 56 are formed.

In the present invention, the device isolation layers 52 define a first active region and second active regions intersecting the first active region. The control gate electrodes 56 cross over the first active region and are disposed parallel to the second active regions. Also, the pair of control gate electrodes 56 are disposed between the second active regions. The source regions 66s are formed in the second active regions, and the drain region 66d is formed in the first active region. A plurality of first second active regions are defined in the semiconductor substrate 50. Therefore, the source regions 66s are formed along the second active regions so that the source regions 66s are shared by other memory cells sharing the control gate electrodes 56. The source regions 66s may be formed deeper than the drain region 66d and have a double diffused structure for resistance to high voltage and capacitive coupling with the floating gates 64f.

In the present invention, high integration may be realized by decreasing the width of the floating gates 64f. Although a horizontal distance between the source regions 66s and the drain region 66d becomes small due to decrease of the width of the floating gates 64f, this may be compensated by increasing the depth into the trenches in which the floating gates 64f are formed to provide a vertical distance. That is, a channel length (L) between the source regions 66s and the drain region 66d may become longer depending on the shape of the trenches 60. The control gate electrode 56 may have a large thickness toward the source region 66s and a small thickness toward the drain regions 66d, that is, an asymmetric structure around the floating gate 64f.

In a program operation, a high voltage is applied to the source regions 66s, and a channel is formed under the floating gates 64f by capacitive coupling between the source regions 66s and the floating gates 64f. Electrons supplied from the grounded drain region 66d are injected into the floating gates 64f through the tunnel insulating layer 62. An erase voltage is applied to the control gate electrodes 56 to perform an erase operation through the tunnel insulating layer 62 between the control gate electrodes 56 and the floating gates 64f.

FIGS. 3A, 4A, 5A, 6A, 7A and 8A are plan views illustrating a method of fabricating a nonvolatile memory device according to an embodiment of the present invention, and FIGS. 3B, 4B, 5B, 6B, 7B and 8B are sectional views taken along lines II-II' of FIGS. 3A, 4A, 5A, 6A, 7A and 8A, respectively.

Figure 3A:
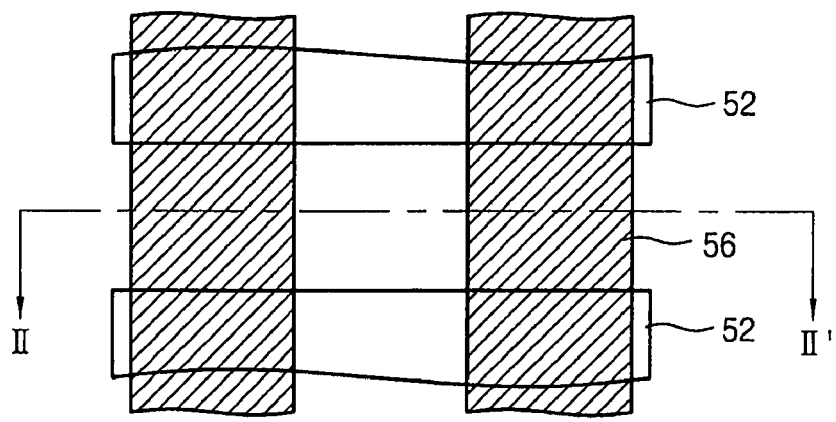
FIGS. 3A, 4A, 5A, 6A, 7A and 8A are plan views illustrating a method of fabricating a nonvolatile memory device according to an embodiment of the present invention.
Figure 3B:
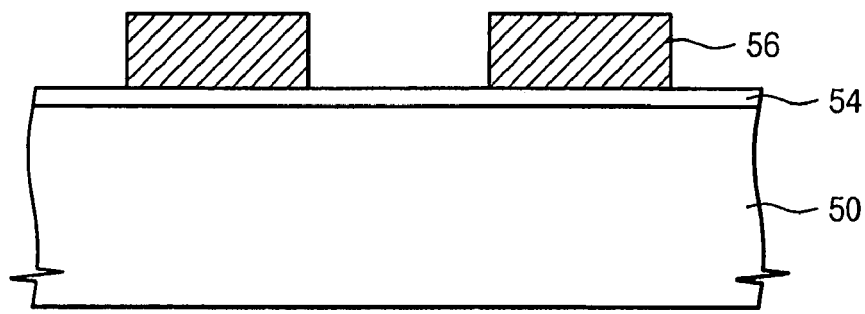
FIGS. 3B, 4B, 5B, 6B, 7B and 8B are sectional views taken along lines II-II' of FIGS. 3A, 4A, 5A, 6A, 7A and 8A, respectively.

Referring to FIGS. 3A and 3B, device isolation layers 52 are formed on a semiconductor substrate 50 to define an active region. A gate insulating layer 54 is formed on the active region. A control gate conductive layer is formed on the gate insulting layer 54. The control gate conductive layer is patterned to form control gate electrodes 56 intersecting a portion above the active region.

Figure 4A:
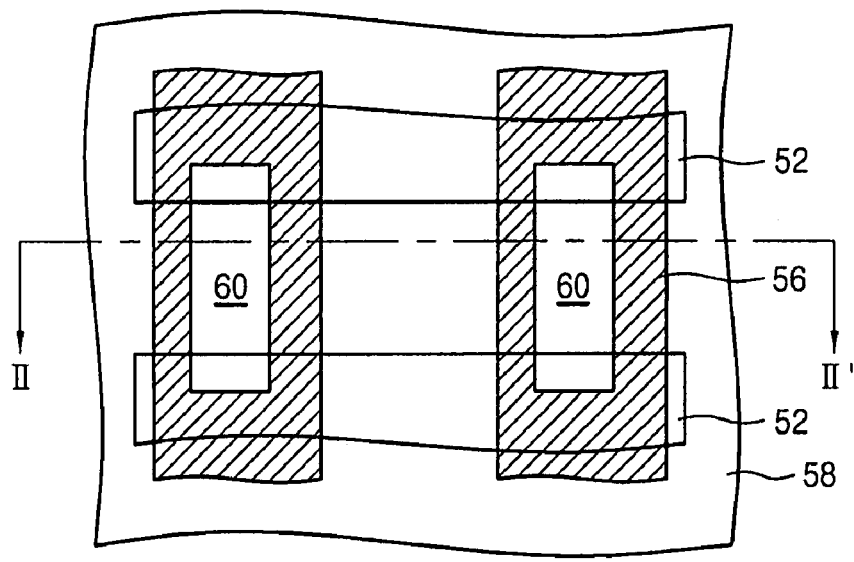
Figure 4B:
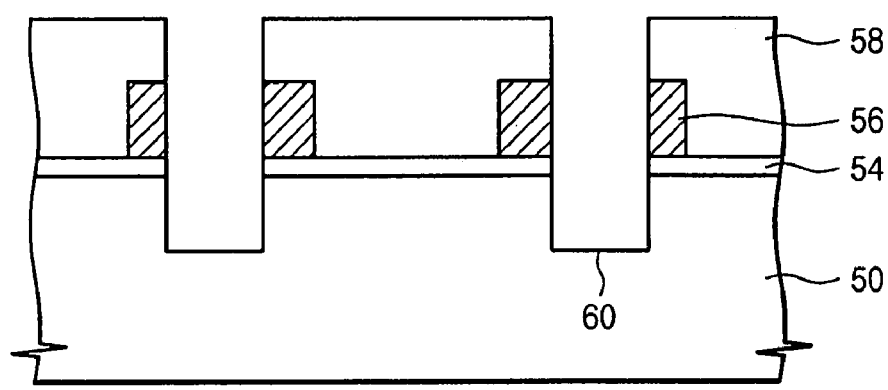

Referring to FIGS. 4A and 4B, a mask pattern 58 having openings partially exposing the control gate electrodes 56 above the active region is formed on an entire surface of the semiconductor substrate 50 where the control gate electrodes 56 are formed. Next, the control gate electrodes 56 and the gate insulating layer 54, and portions of the semiconductor substrate 50 are successively etched using the mask pattern 58 as an etch mask to form trenches 60 in the semiconductor substrate 50.

The trenches 60 may be formed after forming the control gate electrodes 56. Alternatively, after the control gate conductive layer is formed prior to the patterning thereof, the control gate conductive layer, the gate insulating layer 54, and the semiconductor substrate 50 may be etched to form the trenches 60. In this case, the mask pattern is removed after the trenches 60 are formed, and then the control gate conductive layer may be patterned to form the control gate electrodes 56 crossing over the active region.

Figure 5A:
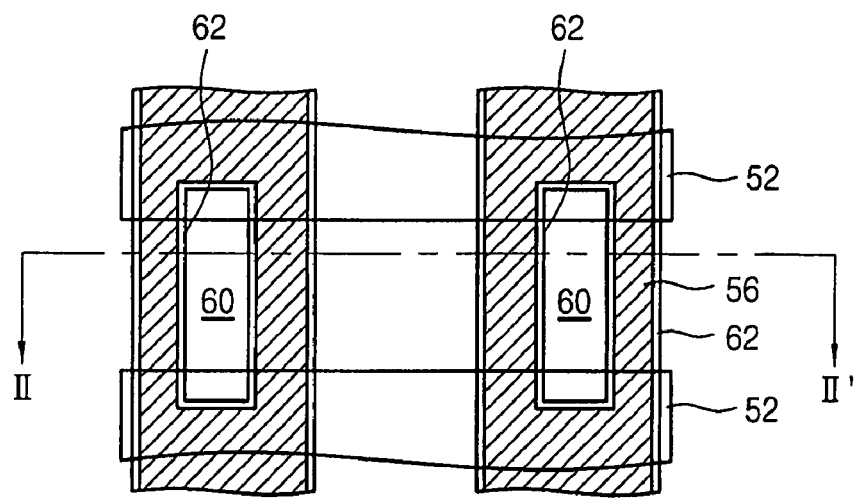
Figure 5B:
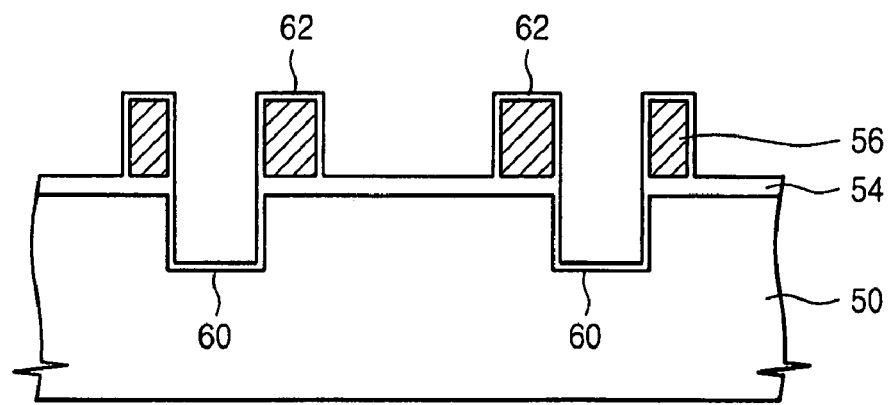

Referring to FIGS. 5A and 5B, the mask pattern 58 is removed, and then a tunnel insulating layer 62 is formed on surfaces of the semiconductor substrate 50 exposed through the trenches 60 and surfaces of the control gate electrodes 56. The tunnel insulating layer 62 is successively formed on the semiconductor substrate 50 exposed through the trenches 60 and sidewalls of the control gate electrodes 56.

Figure 6A:
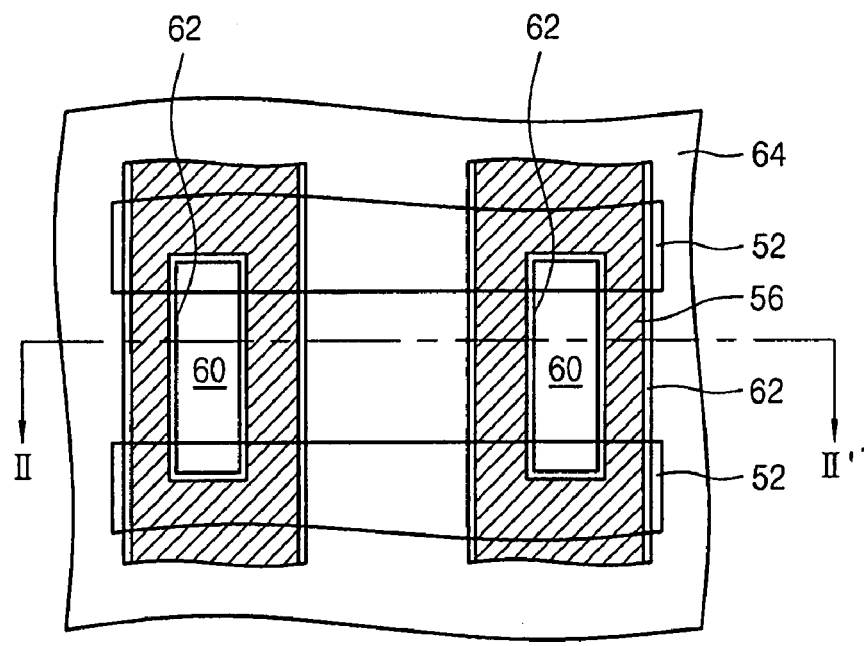
Figure 6B:
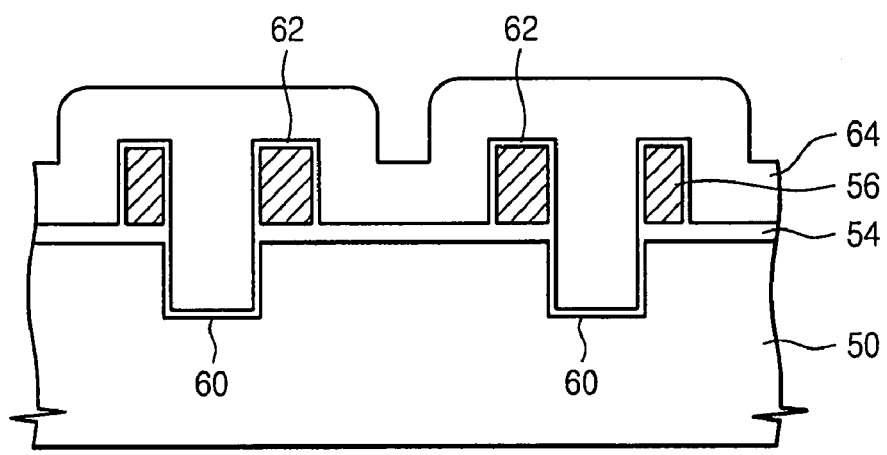

Referring to FIGS. 6A and 6B, a floating gate conductive layer 64 is formed on an entire surface of the semiconductor substrate 50. The floating gate conductive layer 64 is filled in the trenches 60 and openings above the trenches 60, wherein the openings have sidewalls formed by the tunnel insulating layer 62 formed on the control gate electrodes 56.

Figure 7A:
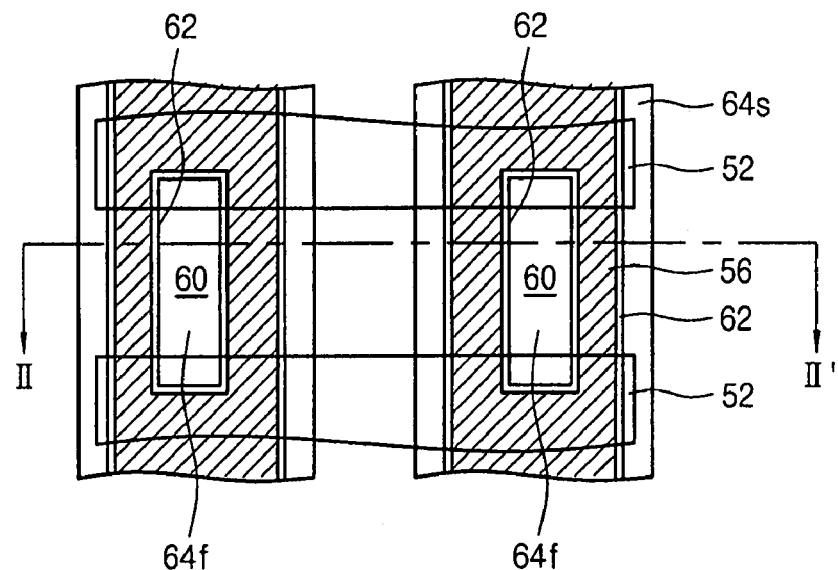
Figure 7B:
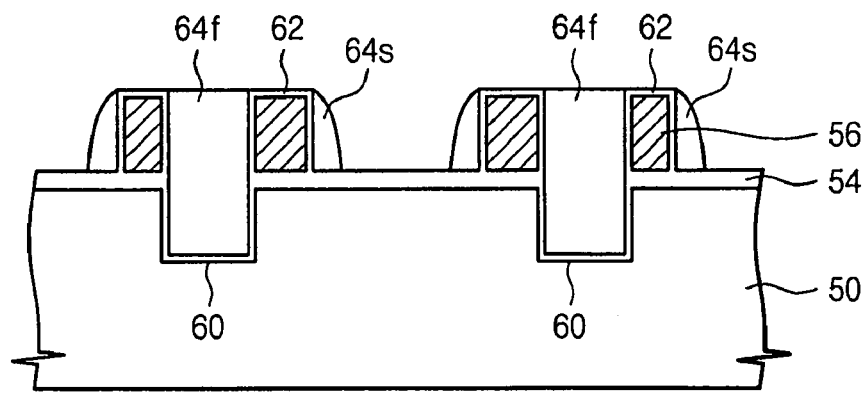

Referring to FIGS. 7A and 7B, the floating gate conductive layer 64 is patterned to expose the tunnel insulating layer 62 formed on upper surfaces of the control gate electrodes 56 or the upper surfaces of the control gate electrodes 56. Floating gates 64f are formed in the trenches 60 to penetrate the control gate electrodes 56 and extend to a predetermined depth in the semiconductor substrate 50. Also, spacer patterns 64s are formed on sidewalls of the control gate electrodes 56.

Figure 8A:
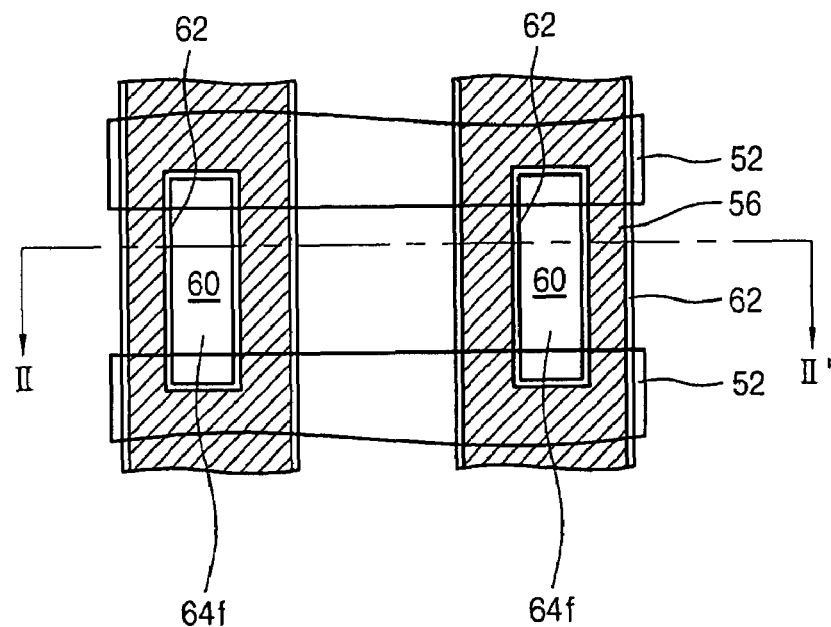
Figure 8B:
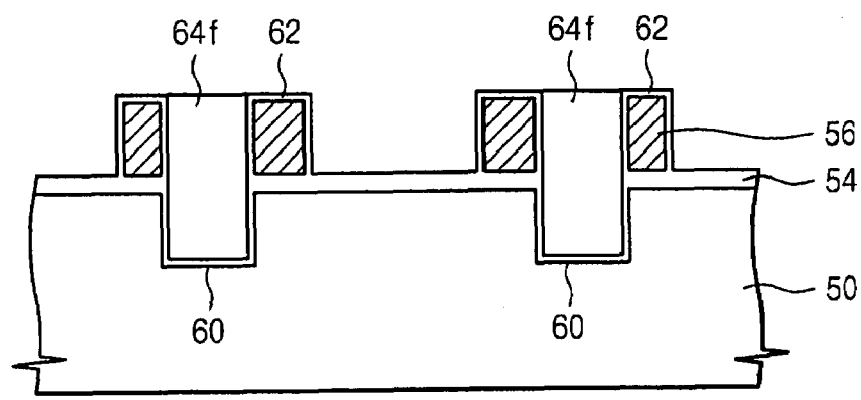

In forming and patterning of the floating gate conductive layer 64, the spacer patterns 64s may not be formed by forming the trenches 60 when the control gate conductive layer is formed before forming the control gate electrodes 56. When the trenches 60 are formed before patterning the control gate conductive layer, the tunnel insulating layer 62 may be formed before the control gate conductive layer is patterned to the control gate electrodes 56. The structure without the spacer patterns 64s may be formed by forming the tunnel insulating layer 62, forming the floating gates 64f, and forming the control gate electrodes 56, as illustrated in FIGS. 8A and 8B.

Next, impurities are implanted into active regions at both sides of the control gate electrodes 56 to form a drain region 66d in the active region between the control gate electrodes 56, and form source regions 66s in active regions at both sides of the pair of control gate electrodes 56, respectively. The source regions 66s may have a double diffused structure which is resistant to high voltage. Specifically, the source regions 66s pass through the active regions where the control gate electrodes 56 are formed, and extend to predetermined portions such that they overlap sidewalls or bottoms of the floating gates 64f. Also, the source regions 66s are formed along the active regions defined in a direction parallel to the control gate electrodes 56 so that they are shared by other memory cells sharing the control gate electrode 56.

In the above-described embodiment, a high voltage is applied to the source regions shared by the memory cells sharing the control gate electrode 56. However, the present invention may be applied to the cell array in which a programming voltage is applied to the drain region 66d formed in the active region between the control gate electrodes 56.

Figure 9A:
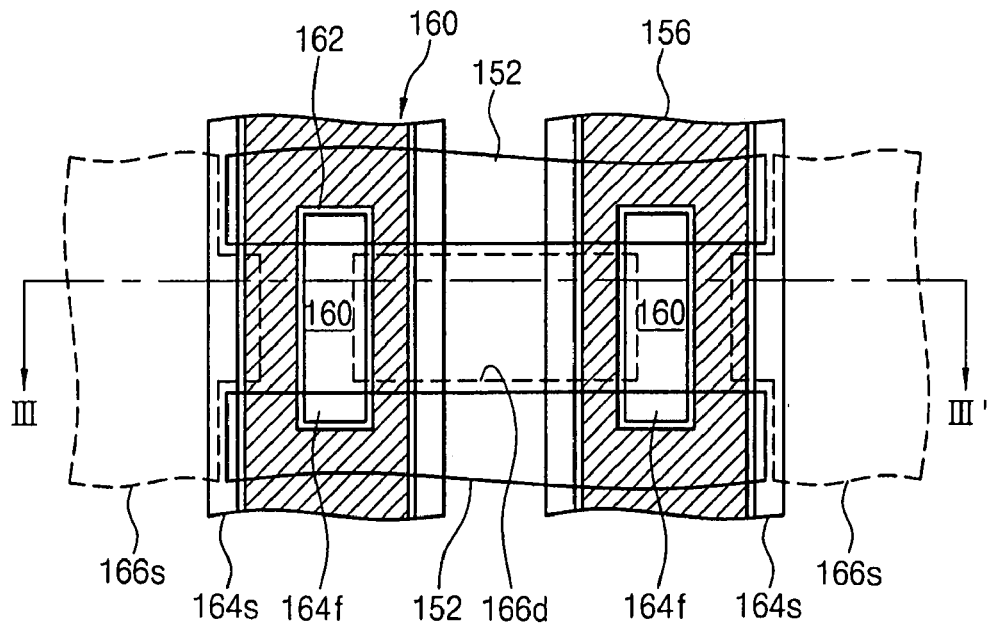
FIG. 9A is a plan view of a nonvolatile memory device according to another embodiment of the present invention.
Figure 9B:
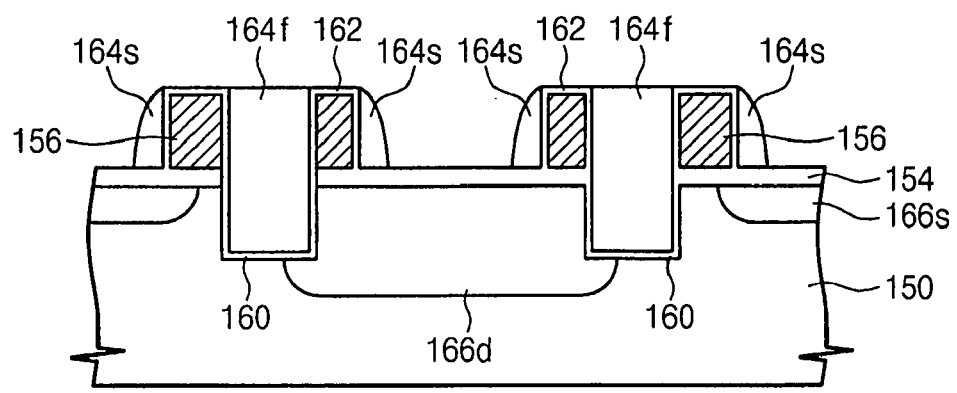
FIG. 9B is a sectional view taken along a line III-III' of FIG. 9A.

FIGS. 9A and 9B are a plan view and a sectional view of a nonvolatile memory device according to another embodiment of the present invention, respectively.

Referring to FIGS. 9A and 9B, device isolation layers 152 are formed on a semiconductor substrate 150 to define an active region. A pair of control gate electrodes 156 are disposed such that they cross over the device isolation layers 152 and the active region. Trenches 160 having a predetermined depth are formed in the active region, and floating gates 164f are formed to penetrate the control gate electrodes 156. The floating gates 164f are filled in the trenches 160 to extend to a predetermined depth in the semiconductor substrate 150.

A gate insulating layer 154 is interposed between the control gate electrodes 156 and the active region, and a tunnel insulating layer 162 is successively formed between the control gate electrodes 156 and the floating gates 164f, and between the floating gates 164f and the semiconductor substrate 150. The tunnel insulating layer 162 may be connected to the gate insulating layer 154, and may be successively formed on upper surfaces and outer sidewalls of the control gate electrodes 156.

Spacer patterns 164s may be formed on sidewalls of the control gate electrodes 156. The spacer patterns 164s may be formed together with the floating gates 164f that are formed after forming the control gate electrodes 156. When the floating gates 164f are formed before forming the control gate electrodes 156, the spacer patterns 164s may not be formed.

A drain region 166d is formed in the active region between the control gate electrodes 156, and source regions 166s are formed in the active region at both sides of the pair of control gate electrodes 156. In another embodiment of the present invention, the drain region 166d passes through the active region under the control gate electrode 156 and extends to the active region under the trenches 160 where the tunnel insulating layer 162 is formed. That is, the drain region 166d extends to surfaces of the semiconductor substrate 150 on which the tunnel insulating layer 162 is formed, and the source regions 166s diffuse to the active region where the control gate electrodes 156 are formed.

In the present invention, the device isolation layers 152 define a first active region and second active regions intersecting the first active region. The control gate electrodes 156 crossing over the first active region are disposed parallel to the second active region. Also, the pair of the control gate electrodes 156 are disposed between the second active regions. The source regions 166s are formed in the second active region, and the drain region 166d is formed in the first active region. A plurality of first and second active regions are defined in a semiconductor substrate. Therefore, the source regions 166s are formed along the second active regions they are shared by other memory cells sharing the control gate electrode 156. The drain region 166d may be formed deeper than the source regions 166s and have a double diffused structure for resistance to high voltage and capacitive coupling with the floating gates 164f.

In a program operation, a high voltage is applied to the drain region 166d, and a channel is formed under the floating gates 164f by a capacitive coupling between the drain region 166d and the floating gates 164f. Electrons supplied from the grounded source regions 166s are injected into the floating gates 164f through the tunnel insulating layer 162. Meanwhile, an erase voltage is applied to the control gate electrodes 156 to perform an erase operation through the tunnel insulating layer 162 between the control gate electrodes 156 and the floating gates 164f.

According to the present invention, floating gates extend to a predetermined depth into a substrate, sufficiently obtaining a channel length, and preventing the punch-through from being generated between source regions and a drain region, though the width of the floating gates decreases for the high integration.

In addition, since the floating gates and control gate electrodes are disposed parallel to each other, the control gate electrodes are not deformed, thus preventing over-etching of the substrate due to the non-uniformity of the thickness of the control gate electrodes when patterning the control gate electrodes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nonvolatile memory device, comprising:
an active region defined in a semiconductor substrate, the active region having a trench;

a control gate electrode crossing over the active region and defining an opening, wherein a gate insulating layer is interposed between the control gate electrode and the active region, and the opening penetrates the control gate electrode and is self-aligned to the trench;

a tunnel insulating layer formed along an inner surface of the trench and the opening;

a floating gate completely filling the trench and the opening to penetrate the control gate electrode; and a source region and a drain region formed in the active region at both sides of the control gate electrode, wherein one of the source region and the drain region laterally extends to a surface of the semiconductor substrate where the tunnel insulating layer is formed, and wherein a width of the control gate electrode directed toward one of the source region and the drain region from the floating gate is greater than a width of the control gate electrode directed toward the other one of the source region and the drain region.

2. The nonvolatile memory device of claim 1, wherein one of the source region and the drain region that is adjacent to a portion of the control gate electrode having a relatively smaller width, laterally extends to a surface of the semiconductor substrate where the tunnel insulating layer is formed.

3. The nonvolatile memory device of claim 1, further comprising spacer patterns formed on sidewalls of the control gate electrode with an insulating layer interposed therebetween.

4. The nonvolatile memory device of claim 3, further comprising a source region and a drain region formed in the active region at both sides of the control gate electrode, respectively, wherein one of the source region and the drain region extends to the active region where the spacer patterns are formed and a portion of the active region where the control gate electrode is formed, and the other one of the source region and the drain region passes through the active region where the spacer patterns are formed and the active region where the control gate electrode is formed, and laterally extends to a surface of the semiconductor substrate where the tunnel insulating layer is formed.

5. A nonvolatile memory device, comprising:

a first active region and second active regions intersecting the first active region defined in a semiconductor substrate, the first active region having trenches;

a pair of control gate electrodes disposed parallel to the second active regions between the second active regions and crossing over the first active region and defining openings in the respective control gate electrodes, the openings penetrate the control gate electrodes and are self-aligned to the trenches;

a tunnel insulating layer covering an inner surface of the trenches and the openings;

floating gates completely filling the trenches and the openings to penetrate the respective control gate electrodes;

source regions formed in the second active regions at both sides of the pair of control gate electrodes; and a drain region formed in the first active region between the control gate electrodes, wherein one of the source and drain regions laterally extends to a surface of the semiconductor substrate where the tunnel insulating layer is formed, and wherein a width of the control gate electrode directed toward one of the source region and the drain region from the floating gate is greater than a width of the control gate electrode directed toward the other one of the source region and the drain region.

6. The nonvolatile memory device of claim 5, wherein one of the source region and the drain region that is adjacent to a portion of the control gate electrode having a relatively smaller width, laterally extends to a surface of the semiconductor substrate where the tunnel insulating layer is formed.

7. The nonvolatile memory device of claim 5, further comprising spacer patterns formed on sidewalls of the control gate electrode with an insulating layer interposed therebetween.

8. The nonvolatile memory device of claim 7, further comprising a source region and a drain region formed in the active region at both sides of the control gate electrode, respectively, wherein one of the source region and the drain region extends to the active region where the spacer patterns are formed and a portion of the active region on which the control gate electrode is formed, and the other one of the source region and the drain region passes through the active region where the spacer patterns are formed and the active region where the control gate electrode is formed, and laterally extends to a surface of the semiconductor substrate where the tunnel insulating layer is formed.

9. The nonvolatile memory device of claim 1, wherein sidewalls of the floating gate are formed along entire inner walls of the opening.

10. The nonvolatile memory device of claim 1, wherein the substrate adjacent to the bottom of the trench serves as a channel.

11. The nonvolatile memory device of claim 5, wherein sidewalls of the floating gates are formed along entire inner walls of the openings.

12. The nonvolatile memory device of claim 5, wherein the substrate adjacent to the bottom of the trenches serves as a channel.

* * * * *